(12) United States Patent
Nelson

(10) Patent No.: US 10,608,397 B2
(45) Date of Patent: Mar. 31, 2020

(54) LASER BURST LOGGING SYSTEMS AND METHODS

(71) Applicant: nLIGHT, Inc., Vancouver, WA (US)

(72) Inventor: Michael C. Nelson, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 16/293,559

(22) Filed: Mar. 5, 2019

(65) Prior Publication Data

US 2019/0280447 A1    Sep. 12, 2019

Related U.S. Application Data

(60) Provisional application No. 62/639,455, filed on Mar. 6, 2018.

(51) Int. Cl.
| | |
|---|---|
| *H01S 3/13* | (2006.01) |
| *H01S 3/00* | (2006.01) |
| *H01S 3/102* | (2006.01) |
| *H01S 3/091* | (2006.01) |
| *H01S 3/10* | (2006.01) |
| *H01S 3/131* | (2006.01) |
| *H01S 3/04* | (2006.01) |
| *H01S 3/0941* | (2006.01) |
| *H01S 5/068* | (2006.01) |

(52) U.S. Cl.
CPC .......... *H01S 3/0014* (2013.01); *H01S 3/0912* (2013.01); *H01S 3/1022* (2013.01); *H01S 3/1028* (2013.01); *H01S 3/10069* (2013.01); *H01S 3/13* (2013.01); *H01S 3/1301* (2013.01); *H01S 3/1312* (2013.01); *H01S 3/13013* (2019.08); *H01S 3/13017* (2019.08); *H01S 3/1317* (2013.01); *H01S 3/0407* (2013.01); *H01S 3/0941* (2013.01); *H01S 5/06825* (2013.01)

(58) Field of Classification Search
CPC .. H01S 3/0014; H01S 3/0912; H01S 3/10069; H01S 3/1022; H01S 3/1028; H01S 3/0407; H01S 3/13; H01S 3/1301; H01S 3/13013; H01S 3/13017; H01S 3/1312; H01S 3/1317
See application file for complete search history.

(56) References Cited

U.S. PATENT DOCUMENTS

| | | | | |
|---|---|---|---|---|
| 2019/0089110 A1* | 3/2019 | Movassaghi | ........ | H01S 3/10069 |
| 2019/0173253 A1* | 6/2019 | Honda | .................... | H01S 3/067 |
| 2019/0213479 A1* | 7/2019 | Takigawa | ............... | B23K 26/03 |

* cited by examiner

*Primary Examiner* — Kinam Park
(74) *Attorney, Agent, or Firm* — Klarquist Sparkman, LLP

(57) ABSTRACT

A burst logging system logs and transmits to a local or remote computing system event data related to errors in and or potential failures of laser system components. The system further provides for capturing data at different rates from different sensors, synchronization of data capture associated with system events and the possibility for aggregation of data from multiple systems, which can in turn be leveraged to predict and or remediate future system events.

20 Claims, 5 Drawing Sheets

SOFTWARE 180 IMPLEMENTING
LASER SYSTEM LOGGING FAULT DETECTION

LASER BURST LOGGING SYSTEMS AND METHODS

CROSS REFERENCE TO RELATED APPLICATION

This application claims the benefit of U.S. Provisional Application No. 62/639,455, filed Mar. 6, 2018, which is hereby incorporated by reference in its entirety.

FIELD

This disclosure pertains to methods and apparatus for monitoring laser systems.

BACKGROUND

A modern laser is a complex system of electronics and software. Such lasers typically have many sensors and acquire various kinds of data to monitor system health and protect the laser system from damage upon failure of one or more components. System failures can result in catastrophic damage that can be both costly and time-consuming to repair. Typical laser system monitoring provides notice of failure, but does not provide advance detection of failures, or conditions that may potentially lead to failures. Systems that can detect and store data on conditions that exist prior to or concurrent with failure of one or more laser system components, and associate such data with failure of specific components are needed. Such systems would preferably have the capability to diagnose failures for remote laser systems, so that responsive alerts and/or actions can be taken just as they would if the laser system were local.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, oscilloscope-type behavior is embedded within a computer-connected laser system to preserve the sensor and system data before a component failure. Historically, oscilloscopes were devices that use a cathode-ray tube or similar instrument to depict on a screen periodic changes in an electric quantity, as voltage or current. In one embodiment, similar functionality is embedded in a burst logging system comprising laser system components, a controller, sensors, and computer components configured to capture and store data relating to a system component failure at or near the time that a failure occurs.

For example, in some preferred embodiments, data may be sampled periodically at varying data rates for different sensors. Photodiodes, for instance, may be sampled at a given rate, which tends to be very fast, e.g., measured in microseconds, while voltage sensors may have a slower rate, e.g., measured in milliseconds, and thermal sensors may be slower still, perhaps measured as infrequently as once a second or less. Even in this example, however, it may be desirable to synchronize data capture at or around the time of system events such as sensing parameters that fall outside of a desired operating range or exceed a given threshold tolerance, or other system errors or system component failures. So, for instance, while thermal sensors may only typically be sampled at once a second, in the event that a condition associated with a known failure event occurs, it might be desirable to immediately sample the temperature as well as other parameters and to report and store that information for later use in comparison with active laser systems to better predict future failure events.

In another embodiment, data captured in conjunction with system events such as component failures can be aggregated and used as a reference to predict or diagnose later system failures when similar data patterns are observed.

In still another embodiment, a system is provided to allow a computer system and/or its user to retrieve data relating to system events from one or more remote laser systems/users and in some cases to aggregate this data for the purpose of providing automated or "smart" analytics that may be useful for diagnosis of potential system events in laser systems making use of the systems described herein. This embodiment may be employed to facilitate "data mining" over a network to provide burst log data to a central server, to track and store data across multiple lasers, to identify trends and potentially to anticipate future issues based on tracked data, to self-diagnose potential issues, and to take preventative action based on comparison of individual laser data to historical data, analysis of aggregated data, and trend or pattern spotting in captured burst logging data. In this way, data from numerous similar lasers can be logged, categorized, and stored in a knowledge base, to which current laser data can be compared to identify specific conditions that have previously been observed. Then, when similarities are identified, additional data can be logged, and the user can be notified.

The foregoing and other objects, features, and advantages will become more apparent from the following detailed description, which proceeds with reference to the accompanying figures.

As described herein, a variety of other features and advantages can be incorporated into the technologies as desired.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Computing Systems

Figure 1:
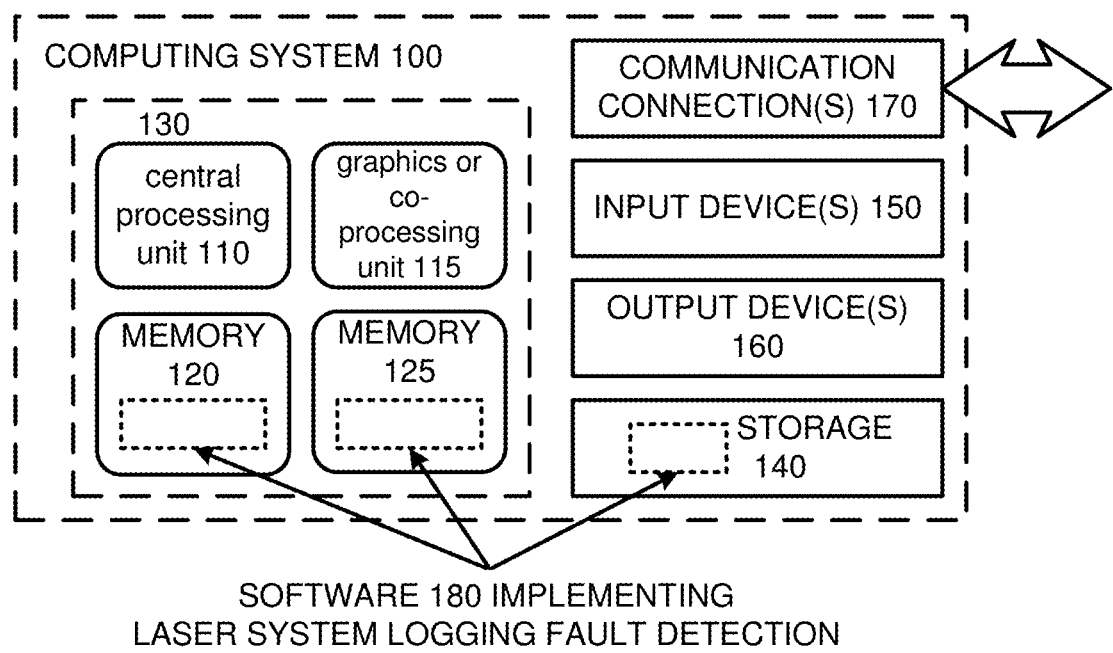
FIG. 1 is an example computing system that can be used in conjunction with the technologies described herein.

FIG. 1 depicts a generalized example of a suitable computing system 100 in which the described innovations may be implemented. The computing system 100 is not intended to suggest any limitation as to scope of use or functionality, as the innovations may be implemented in diverse general-purpose or special-purpose computing systems.

With reference to FIG. 1, the computing system 100 includes one or more processing units 110, 115 and memory 120, 125. The processing units 110, 115 execute computer-executable instructions. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 1 shows a central processing unit 110 as well as a graphics processing unit or co-processing unit 115. The tangible memory 120, 125 may be volatile memory (e.g., registers, cache, RAM), non-volatile memory (e.g., ROM, EEPROM, flash memory, etc.), or some combination of the two, accessible by the processing unit(s). The memory 120, 125 stores software 180 implementing one or more innovations described herein, in the form of computer-executable instructions suitable for execution by the processing unit(s).

A computing system may have additional features. For example, the computing system 100 includes storage 140, one or more input devices 150, one or more output devices 160, and one or more communication connections 170. An interconnection mechanism (not shown) such as a bus, controller, or network interconnects the components of the computing system 100. Typically, operating system software (not shown) provides an operating environment for other software executing in the computing system 100, and coordinates activities of the components of the computing system 100.

The tangible storage 140 may be removable or non-removable, and includes magnetic disks, magnetic tapes or cassettes, CD-ROMs, DVDs, or any other medium which can be used to store information and which can be accessed within the computing system 100. The storage 140 stores instructions for the software 180 implementing one or more innovations described herein.

The input device(s) 150 may be a touch input device such as a keyboard, mouse, pen, or trackball, a voice input device, a scanning device, or another device that provides input to the computing system 100. For video encoding, the input device(s) 150 may be a camera, video card, TV tuner card, or similar device that accepts video input in analog or digital form, or a CD-ROM or CD-RW that reads video samples into the computing system 100. The output device(s) 160 may be a display, printer, speaker, CD-writer, or another device that provides output from the computing system 100.

The communication connection(s) 170 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier, and may also refer to network communications connections, such as the Internet, as further described herein.

The innovations can be described in the general context of computer-executable instructions, such as those included in program modules, being executed in a computing system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Network-Supported Environment

Figure 2:
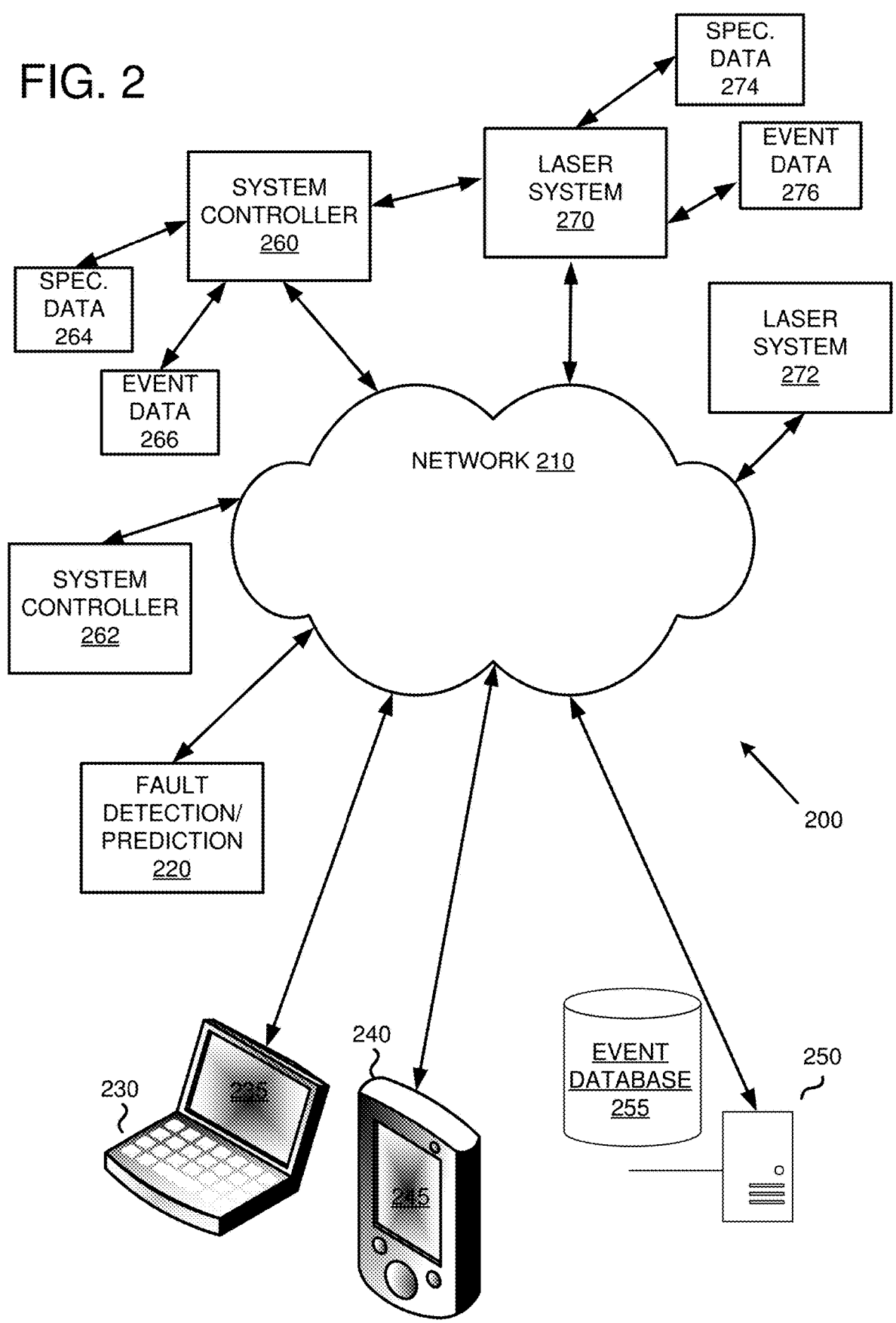
FIG. 2 is an example network-support environment that can be used in conjunction with some described embodiments of the technologies described herein.

FIG. 2 illustrates a generalized example of a suitable network-supported environment 200 in which described embodiments, techniques, and technologies may be implemented. It is understood that, in this context, the term network is to be interpreted broadly to cover any number of different implementations of networked systems, including but not limited to those utilizing the Internet, or some other networking system that allows the system to leverage computing resources situated in locations that need not be local to the laser system(s) being monitored and/or controlled. In the disclosed example environment 200, various types of services (e.g., computing services) are provided by a network 210. For example, the network 210 can comprise a collection of computing devices, which may be located centrally or distributed, that provide network-based services to various types of users and devices connected via a network such as the Internet. The implementation environment 200 can be used in different ways to accomplish computing tasks. For example, some tasks (e.g., processing user input and presenting a user interface) can be performed on local computing devices (e.g., connected devices 230, 240) while other tasks (e.g., storage of data to be used in subsequent processing) can be performed using a remote computing system located elsewhere in the network 210, such as a network database server 250.

In example environment 200, the network 210 provides one or more laser control system controllers 260, 262 access to computing resources associated with one or more connected devices 230, 240, 250 with a variety of capabilities, and which may be remote from the location of the laser system being monitored. In turn, each system controller 260 may be coupled to one or more laser systems 270, 272 that are either local to the system controller (as shown with system controller 260 and laser system 270), or remote, as described further herein. Connected device 230 represents a device with a computer screen 235 (e.g., a mid-size screen). For example, connected device 230 could be a personal computer such as a desktop computer, laptop, notebook, netbook, or the like. Connected device 240 represents a device with a mobile device screen 245 (e.g., a small size screen). For example, connected device 240 could be a mobile phone, smart phone, personal digital assistant, tablet computer, and the like. Connected device 250 represents a network database server with an event database 255 capable of storing event data collected and/or stored in accordance with the techniques described herein. Connected device 250 may or may not have an associated display device. Devices without display capabilities can be used in example environment 200. For example, the network 210 can provide access to information and/or services provided on one or more computers (e.g., server computers) without displays, or may be used to connect one or more system controllers 260 or any of the other connected devices described herein. Thus, laser system event data may be stored locally, or remotely, and accessed on any suitable type of computing device, be it a tablet, a laptop, a desktop computer, a server computer, or some other form of suitable computing device with associated storage. As such, monitoring of failure events or indications of potential future failure events may also be performed locally or remotely. Additionally, because sensors having a very fast sampling rate generate a large volume of data, which would require a greater bandwidth to transmit over a network, according to the techniques described herein, it is possible to process certain data sets locally, partially digest the results, and then only transmit the partially digested data sets to a remote system for comparison with previously stored data. Additionally or alternatively, specific laser systems may provide local storage for specification data and/or event data (274 and 276, respectively), and/or data storage may be provided at the system controller for specification data and/or event data for a given controller's associated systems (264 and 266, respectively).

Fault detection and or prediction services can be provided via the network 210 through one or more fault detection/prediction service providers 220, or through other providers of online services (not depicted). Additionally, network services can be customized to the display capability and/or other capabilities of a particular connected device (e.g., connected devices 230, 240, 250).

In example environment 200, the network 210 provides the technologies and solutions described herein to the various connected devices 230, 240, 250 using, at least in part, the remote service providers 220. For example, the remote service providers 220 can provide a centralized solution for various network-based services. The remote service providers 220 can in some implementations manage service subscriptions for users and/or devices (e.g., for the connected devices 230, 240, 250 and/or their respective users), or in some implementations may provide access to remote computing resources and/or one or more centralized stores of information useful for implementing the techniques disclosed herein. In other embodiments, fault detection and or prediction services may be performed locally using, for example, specification data and/or event data stored locally to the laser system and/or the system controller, as described above.

Representative Burst Logging Systems

Figure 3:
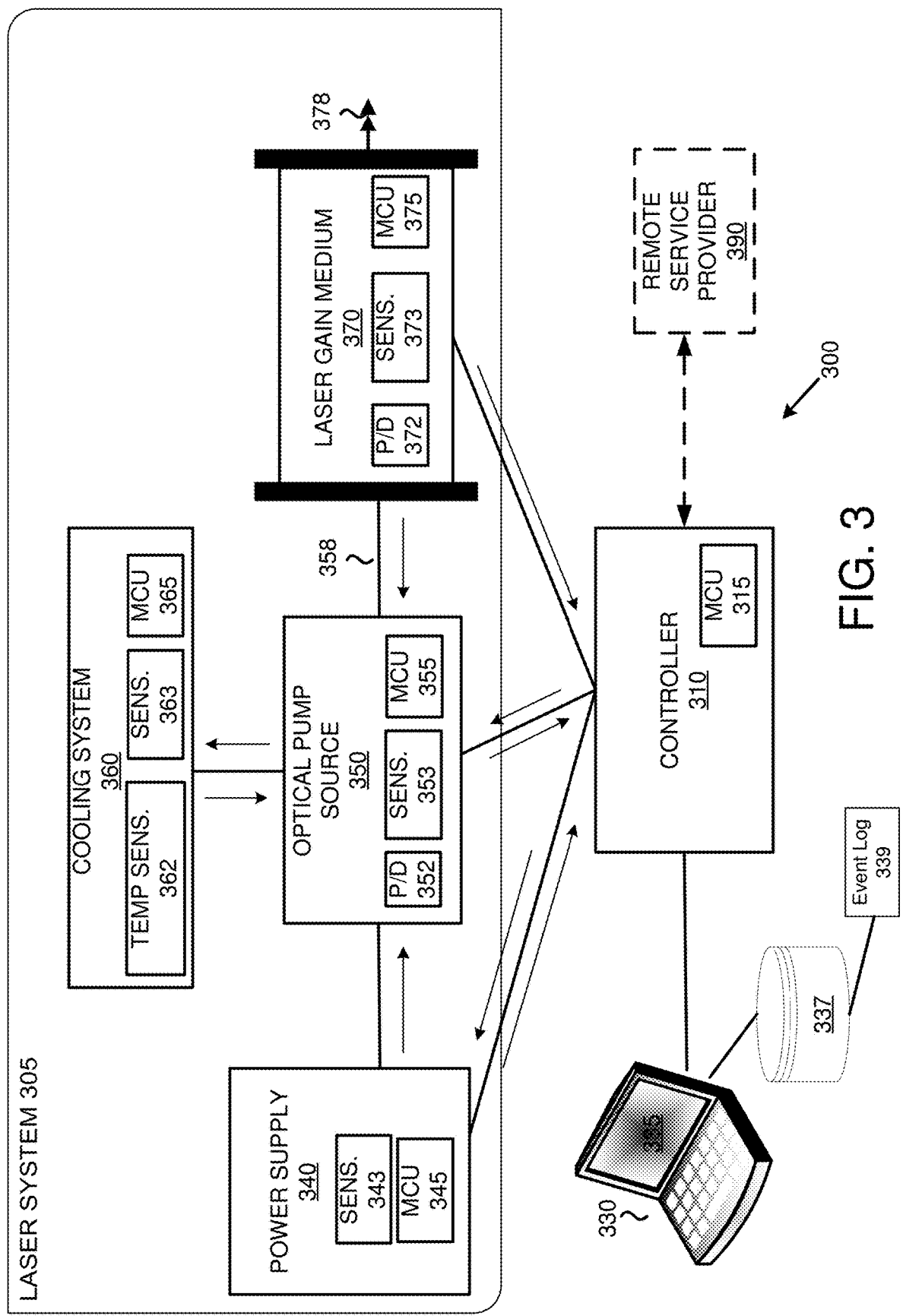
FIG. 3 is an example of a computer controlled burst logging system and laser system that can be used in conjunction with one embodiment of the technologies discussed herein.

FIG. 3 illustrates an exemplary burst logging system 300. Components of a laser system 305 are connected to a controller 310, operatively connected to one or more microcontrollers 315. Controller 310 can be connected to a local computer system 330 having a graphical user interface 335 configured for use by a human operator, or in some embodiments may also be connected to the computer system 330 remotely via a network, so that a user need not be local to the laser system 305 in order to control it. Computer system 330 may be configured as in FIG. 1, and is operatively connected to a database stored in a memory device 337 and includes one or more event logs 339. Optionally, controller 310 may also be connected via a network to a remote service provider 390, which in turn is operatively connected to one or more databases, as shown in FIG. 2. In typical examples, the laser system 305 includes an on-board controller such as controller 310, though controller 310 may also be situated remotely, and may communicate with laser system 305 via a network.

Laser system is comprised of four main components with associated sensors. Representative sensors are described in the following, but more or fewer sensors can be used.

First, a power supply 340 is operatively connected to one or more microcontroller units 345, and to one or more sensors 343 to measure, e.g., current, voltage, and/or temperature. For example, monitoring voltages associated with the power supply may help in detecting drops in voltage, which, in certain cases, may coincide with a potential laser failure event, as discussed further herein. For example, input and/or output voltages and currents, and variations therein can be monitored. Power supply 340 and its associated sensors 343 are also connected to the controller 310, and are configured to provide to the controller 310 data on system parameters over various predetermined intervals and at various predetermined sampling rates, which may be adjusted as needed.

Second, the power supply 340 is operatively connected to an optical pump source 350, which in turn is operatively connected to one or more microcontroller units 355, a photodiode 352, and optionally to one or more additional sensors 353 to measure, e.g., current, voltage, optical signal, and/or temperature. For example, if laser diode pump sources are used, laser diode currents, voltages, output power, temperature and/or wavelength can be monitored. Optical pump source 350 and its associated sensors are also operatively connected to the controller 310, and are also configured to provide to the controller 310 data on system parameters over various predetermined intervals and at various predetermined sampling rates, which may be adjusted as needed, and which may be different from the intervals and/or sampling rates at which data is transmitted from the sensors associated with power supply 340, depending at least in part on the type of sensors and/or the parameter values being reported.

Third, the optical pump source 350 is operatively connected to a cooling system 360, which in turn is also operatively connected to one or more microcontroller units 365, and one or more additional sensors 363 to measure, e.g., current, voltage, and/or temperature. The cooling system is typically a water cooling system using, for example, flow through cooling, a closed loop heat exchanger and/or a closed-loop chiller. Regardless of the type of cooling system utilized, one or more temperature sensors 362 are employed to measure water temperature within the system, particularly the inlet water temperature before coming into contact with the pump optical pump source 350 and outlet water temperature after coming into contact with the optical pump source 350. Cooling system 360 and its associated sensors are also connected to the controller 310, whether directly, or indirectly via the optical pump source 350, and are also configured to provide to the controller 310 data on system parameters over various predetermined intervals and at various predetermined sampling rates, which may be adjusted as needed, and which may be different from the intervals and/or sampling rates at which data is transmitted from the sensors associated with power supply 340 and optical pump source 350, depending at least in part on the type of sensors and/or the parameter values being reported. Typically, sensors provide input/output coolant temperature, flow rates, and/or flow pressure.

Fourth, the optical pump source 350 is operatively connected, typically by a fiber 358, to a laser gain medium 370, which in turn is also operatively connected to one or more microcontroller units 375, a photodiode 372, and in some embodiments to one or more additional sensors 373 to measure, e.g., input pump power, pump wavelength, optical output power, output wavelength, output power stability, and/or temperature. Laser gain medium may, in turn, provide an output, typically through a fiber 378. Laser gain medium 370 and its associated sensors are also connected to the controller 310, and are also configured to provide to the controller 310 data on system parameters over various predetermined intervals and at various predetermined sampling rates, which may be adjusted as needed, and which may be different from the intervals and/or sampling rates at which data is transmitted from the sensors associated with power supply 340, optical pump source 350, and cooling system 360 depending at least in part on the type of sensors and/or the parameter values being reported.

In some possible embodiments, water systems for cooling the laser may be employed. In such systems, water is passed through the laser according to one of several known conventional methods, such as using flow through cooling, a closed loop heat exchanger, and or a closed-loop chiller. In such exemplary embodiments, thermal sensors connected to the controller 310 could be configured to measure temperature at both a water inlet and a water outlet, which may be situated adjacent to, and operatively connected to, for example, the optical pump source 350. While it would be expected that temperature readings at the water outlet would be higher than those at the water inlet when the laser is in operation, the controller 310 might trigger a reporting event in cases where the difference between these sensed temperatures exceeds a certain threshold, or in instances where the outlet temperature rises or falls at a rate of change that exceeds a given threshold, which might indicate potential issues with the system. Similarly, water temperature that "creeps up" at a certain sensor, while corresponding changes in temperature changes are not seen at other sensors might be indicative of a potential issue. Because temperature readings at thermal sensors would be expected to change more slowly relative to changes in certain other types of sensors, temperatures at these sensors might be sampled less frequently, at a rate of, e.g., once per second. However it is understood that in certain situations, this rate might be varied based on the needs of the system or upwardly or downwardly adjusted, for example, based on other events taking place in the system at a given time.

Methods for Burst Logging

In any of the examples herein, methods can be provided for identifying potential system failure events for an individual laser system, and updating event tables and failure event profiles, which may be maintained for individual laser systems and/or multiple laser systems. Tracking and storing this data, and comparing to active laser system data can help identify trends and/or anticipate issues, facilitate self-diagnosis of potential problems and/or allow for preventative action that may prevent or mitigate failures and/or damage to system components. While sensor values are generally included in event logs, in some examples, rates of change of sensor values are computed and stored, as well.

Figure 4A:
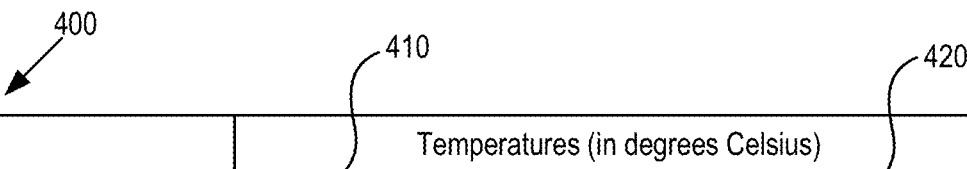
FIG. 4A is an example of an event log that can be used in conjunction with one embodiment of the technologies discussed herein.

FIG. 4A illustrates an exemplary event log 400 for a particular laser system that could be stored remotely or locally. In this simple log, two temperature parameter values representing inlet water temperature 410 and outlet water temperature 420 are stored for a system at a given time point. Data for parameters 410 and 420 may be obtained and stored over a series of predetermined periods in a log containing multiple data points, or it may be overwritten each time a new temperature value is obtained for a given sensor. Event log 400 is a simple 2x1 table with two values obtained at several specific time intervals (in this case, once a second). It is understood that in using such a table, the oldest values could be overwritten once new values are obtained for these parameters, e.g., at the next sampling interval. In some embodiments, an event log could be as simple as a one dimensional table that records a single value for a single parameter at a specific time, and then overwrites this value each time a new parameter value is sensed. In other embodiments, a particular event log may store multiple values for one or more parameters over a given duration using a given sampling interval. In still other more complex embodiments, event log may utilize a multi-dimensional table that stores values for multiple periods of varying durations for multiple parameters associated with multiple sensors obtained utilizing varying sampling intervals. In this way, data from multiple data sets can be analyzed over time to identify patterns in behavior of various groups of sensors relative to one another over time to identify trends associated with system failures. As noted above, event logs can include rate of change of parameters, as well, even though such value can be determined from other stored event data.

Figure 4B:
FIG. 4B is an example of a failure-mode event data profile that can be used in conjunction with one embodiment of the technologies discussed herein.

FIG. 4B illustrates an exemplary failure-mode event data profile 450, which may be utilized according to the techniques described herein. In this simple exemplary failure-mode event data profile, as with the exemplary log in FIG. 4A, two temperature parameter values representing inlet water temperature 460 and outlet water temperature 470 are stored for a system at a given time point. Additionally, a third parameter 480 is stored indicating a "time to system failure" (in minutes). Thus, the set of inlet and outlet water temperature parameters are associated with a failure event that occurred x number of minutes after the event data was obtained. As with the event log described in FIG. 4A, it is understood that a failure-mode event data profile could be as simple as recording a single value for a single parameter at a specific time. In other embodiments, the failure-mode event data profile may include a two-dimensional table that stores values for multiple sensor parameters at a given point in time, or may comprise a multi-dimensional table that stores values for multiple periods of varying durations for multiple parameters, perhaps even parameters with different sampling rates, along with associated time to failure data. In some embodiments, the failure-mode event data profile may include data drawn from multiple system components, such as, for example, the power supply (e.g., voltage in, voltage out, current in, current out), cooling system (e.g., water temperature in, water temperature out), optical pump (e.g., drive current, drive voltage, pump optical power, pump diode temperatures, pump diode wavelengths, number of active pump diodes), and laser gain medium (e.g., optical power, gain medium temperature, state of polarization, wavelength, pulse duration, pulse repetition rate, dopant density). In some embodiments, the profile might also be used to store additional information, such as an identification of specific failure-modes, and/or data on the duration between the time that given failure event data was received and the time that an actual system or component failure took place, or to note conditions that have not been associated with system failures at all, perhaps including a -NULL- time value. In some examples, specification information about the laser system(s) may be included, as well, such as gain fiber length, dopant, core and cladding diameters, numbers of pump diodes, pump diode threshold currents, pump diode wavelengths, beam parameter product, peak power, or average power, among others. In still other examples, manufacturing data such as sources and ages of various components can be included, as well as time of manufacture/assembly of some or all components.

Failure-mode event data profile data may be utilized to compare a given set of event data from an active laser system with previously sensed failure-mode event data to determine the likelihood of a system failure in the active laser system. Additionally, multiple sets of data can be combined to create a multi-dimensional profile to establish the shapes or pattern of two or more sensor data sets, and certain shapes or patterns in the data may be established as a failure-mode event data profile that is associated with one or more failure conditions. In certain embodiments, a given failure-mode event data profile may also include information indicating the temporal proximity between obtaining one or more sets of sensed event data and a corresponding system failure, in order to utilize the "time to fail" from past system failures to predict "time to fail" for an active laser system or a particular system component in the active laser system. This comparison is useful in determining the remedial actions to take in response. For example, if the comparison of a particular set or sets of sensed event data to stored failure-mode event data profiles results in a determination of similarity with event data that preceded a system or component failure by a relatively short time, e.g., less than an hour, this might result in triggering a more aggressive remedial action, such as sending a system shutdown parameter. On the other hand, if the comparison with stored failure-mode event data profiles indicates similarity with event data that preceded a system or component failure by a relatively longer time, e.g., over an hour, the remedial action might simply be to trigger an alarm parameter or other system notification. If the "time to system failure" parameter 480 is -NULL-, this might indicate that the given data set or sets being compared are not similar to data profiles that have previously resulted in a system failure, or alternatively, are sufficiently similar to values that are considered "safe." In this instance, a "system OK" parameter might be set or modified.

Figure 5:
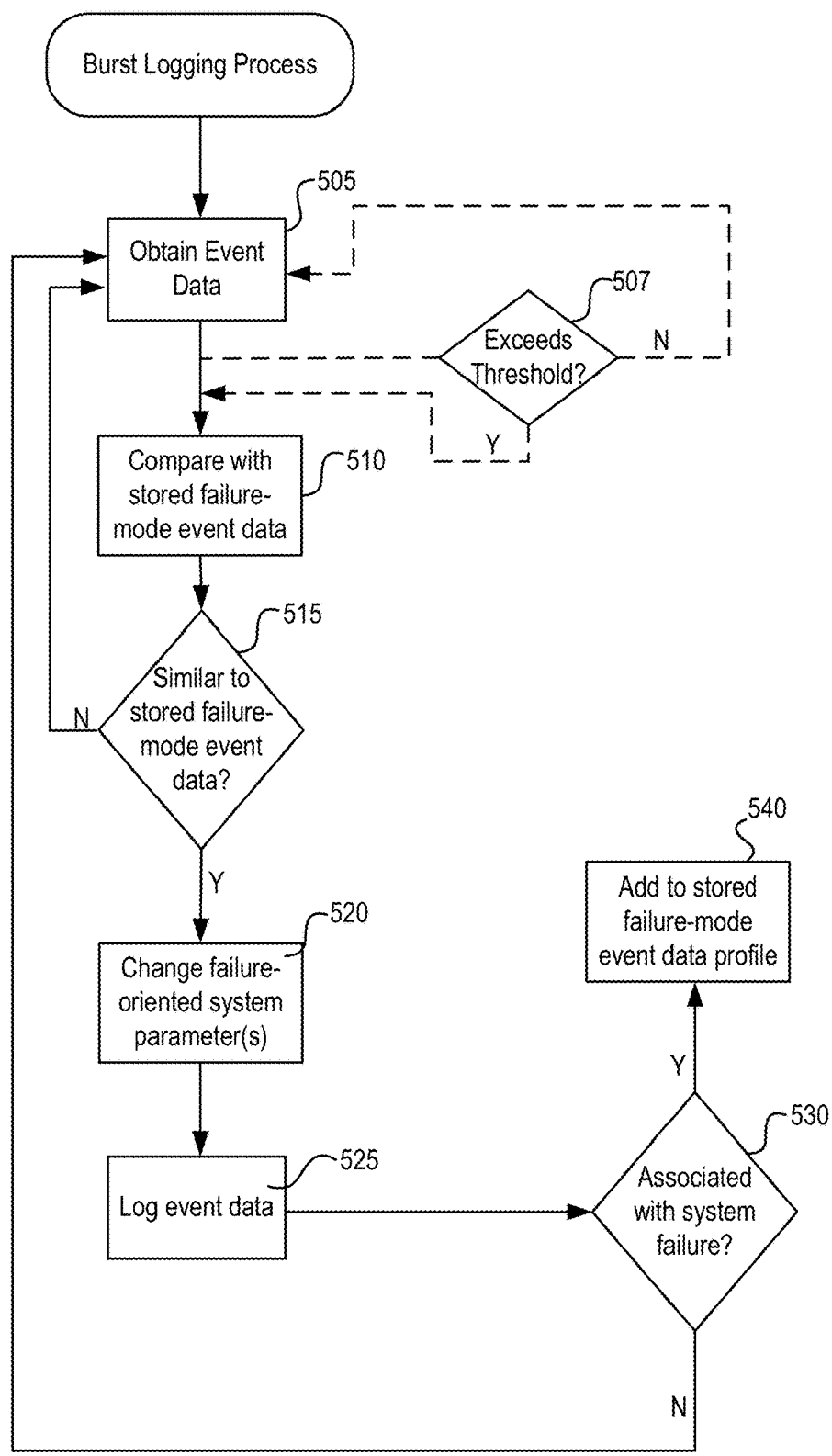
FIG. 5 is a flowchart illustrating a computer controlled burst logging method according to one embodiment of the present invention.

FIG. 5 illustrates the steps performed by a burst logging process according to one exemplary embodiment. In step 505, a first set of event data associated with a first sensor parameter of a first laser system is obtained from a first sensor over a predetermined duration and at a predetermined sampling rate. This first set of event data may reflect either a set of sensor data itself, or a digest of a set of sensor data that may be useful for purposes of comparison and/or other purposes described herein according to the described techniques. Alternatively, rather than receiving only a single set of event data associated with a single sensor at this step, multiple sets of event data sampled over the same or a substantially similar duration may be obtained from multiple sensors (and multiple laser systems). The data obtained from these sensors may or may not have the same sampling rate. This approach facilitates analyzing differences in given data between or among different sets of sensors. For example, if temperature is increasing at a given sensor at a rate which exceeds a given threshold, or which exceeds the increase at other sensor locations, this could be indicative of a component that is not functioning properly, or that could lead to a system failure. Alternatively, a temperature rise at a given sensor might be anticipated at certain times, particularly when temperature or other readings located at other sensors are also changing, such as during active lasing.

In step 510, the event data obtained in step 505 is analyzed and compared with one or more stored failure-mode event data profiles for one or more systems that are similar to the active laser system being monitored. These profiles may represent, for example control settings or expected values, or they may represent values or sets of values associated with past component or system failures. For example, the event data obtained in step 505 might include temperature data from a water outlet thermal sensor. Data from this sensor would be obtained at a given sampling rate (perhaps once per second) and over a given duration, as measured in some unit of time. Such data could then be compared to temperature values or changes in temperature values that would be expected over the given duration, or in particular to values or changes in such values that previously were associated with a system failure event. In some cases, readings at a given sensor might be expected to vary over time in response to system changes, and so single values may not indicate a potential issue. In such cases, values from multiple sensors may be collected and analyzed, so that for instance, one can determine whether temperature at a given location in the system is higher than would be expected given the readings using other sensors at a given time. For example, the temperature for sensors in the cooling system would be expected to be higher when, for example voltage and or optical output readings at other sensors in the laser system indicate that the laser is in an active state. In some embodiments, an expected value or set of values stored as failure-mode event data profiles might be measured in the frequency domain, rather than in the time domain. In such an embodiment, in order to analyze the first event data set, a fast Fourier transform might be utilized to convert the event data measured in the time domain into the frequency domain, so that it can then be compared with one or more failure-mode event data profiles represented in the frequency domain.

In some exemplary embodiments, an optional comparison step 507 is performed before comparing the first set of event data with one or more stored failure-mode event data profiles at step 510. In these embodiments, the first set of event data is measured against one or more predetermined thresholds. If the value or values exceed the associated threshold(s), the system proceeds to perform comparison step 510. On the other hand, if the values do not exceed threshold(s), the system returns to step 505 and obtains another set of event data. So, in this embodiment, an obtained first set of data representing a voltage drop at a power supply might only be compared with one or more stored failure-mode event data profiles in the event that voltage drops at or above a certain rate. If the threshold voltage drop is exceeded, the system proceeds to step 510. If not, the system returns to step 505 and obtains the next set of event data. Or, as in the temperature example above, in step 507 the voltage measured at a given sensor may be analyzed against the readings at other sensors within the system to determine if a given voltage or voltage change at a given sensor is within the range of values that would be expected, given the readings at other sensors. If the value is within the expected range for a normally functioning system, then the system to returns to step 505 and obtains the next set of event data. If the value or change in value exceeds the threshold value for a system in a given configuration, as indicated by the readings at the other sensors in the system, then the system proceeds to step 510, wherein the event data obtained in step 505 is analyzed and compared with one or more stored failure-mode event data profiles for one or more systems that are similar to the active laser system being monitored.

Additional examples of sensors that might be used to obtain event data include photodiodes used to detect pump optical power from one or more laser pump sources, current or voltage sensors to measure power input or output, and or photodiodes to measure optical signals at a given point in the laser system. Or, in some embodiments, event data obtained from multiple sensors over the same or a substantially similar duration may be compared to one or more stored failure-mode event data profiles associated with another laser system similar to the first laser system.

In step 510, the one or more compared event data sets are compared to one or more stored failure-mode event data profiles associated with another laser system similar to the first laser system, according to some predetermined criteria for similarity. For example, a given failure-mode event data profile may be associated with a prior system failure that occurred within 10 seconds in a similar laser system. Another failure-mode event data profile might correspond to a system failure that occurred three hours after obtaining the event data. Another failure-mode event data profile might include values or a range of values that are associated with normal operation. The system response to determining these similarities, however, would vary depending on the data contained in the one or more stored failure-mode event data profiles for which a similarity is determined. Similarity between or among laser systems may be determined based on shared common characteristics and/or specification information between or among the laser systems. In a typical embodiment, for example, similar systems may each contain a single mode oscillator and share otherwise similar specification information, such as the exemplary specification information discussed above. In other examples, similar laser systems may each comprise both a master oscillator and a separately pumped amplifier, while also sharing other similar system specification characteristics, such as those discussed above.

If in step 515 the event data from the first laser system is determined to be similar according to some predetermined criteria to one or more stored failure-mode event data profiles, in step 520 the system is triggered to change one or more failure-oriented system parameters based on this determined similarity. The specific parameter(s) to be modified will typically depend upon the stored data regarding prior system failures. For example, in the determination step 515, a similarity may be determined to a specific failure-mode, and/or to predict a duration until failure of a system or a given system component, based on the data in the stored failure-mode event data profile. If, for example, the stored failure-mode event data profile contains event data associated with a prior system or component failure that occurred three hours after a specific set of event data was obtained, an alert parameter might be generated or modified in response and provided to the controller for the first laser system. Or, in cases where the compared first set of event data is similar to a stored failure-mode event data profile that is associated with a particularly high priority system condition, such as one that in the past has immediately preceded a catastrophic system failure, or preceded a system or component failure that occurred within a very short time (e.g., 10 seconds) after the event data was obtained, the system might modify a system status parameter to send a shutdown parameter to the first laser system before further damage is done to the system or its components. Still further, and in optional embodiments, the first set of event data might be determined to be most similar to a stored failure-mode event data profile that is associated with a normally functioning system. In this case, a parameter value might be returned indicating normal system operation.

In step 525, the one or more sets of event data are logged to form an event data log. This event data log may be stored using computing resources that are local to the first laser system. In some embodiments, this data may be stored only until a subsequent set of event data is generated, at which time the first set of event data may be overwritten. Additionally, in step 530, it is determined whether event data is associated with a system failure event. If so, in step 540 this event data—along with information regarding the time to the associated system failure event—is added to the one or more sets of stored laser failure-mode event data profiles, indicating that the data is associated with a concurrent or subsequent system failure event, and the amount of time (if any) by which obtaining the event data preceded the system failure event.

Example Implementations

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media and executed on a computing device (e.g., any available computing device, including smart phones or other mobile devices that include computing hardware). Computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example and with reference to FIG. 1, computer-readable storage media include memory 120 and 125, and storage 140. By way of example and with reference to FIG. 2, computer-readable storage media include memory and storage 220, 222, and 224. The term computer-readable storage media does not include signals and carrier waves. In addition, the term computer-readable storage media does not include communication connections (e.g., 170, 260, 262, and 264).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

I claim:

1. A method, comprising:
    obtaining with a first sensor a first set of event data of a predetermined duration and sampling rate and associated with a first sensor parameter of a first laser system;
    comparing the first set of event data with one or more sets of stored laser failure-mode event data profiles formed based on one or more other laser systems similar to the first laser system;
    determining a failure event similarity based on the comparing of the first set of event data with the one or more sets of stored laser failure-mode event data profiles; and
    changing a failure-oriented laser system parameter in the first laser system based on the determined failure event similarity.

2. The method of claim 1, further comprising:
    obtaining with a second sensor a second set of event data of a predetermined duration and sampling rate and associated with a second sensor parameter, wherein the predetermined duration of the second set of event data overlaps or is the same as the predetermined duration of the first set of event data and the sampling rate of the second set of event data is different from the sampling rate of the first set of event data; and
    comparing the second set of event data with the one or more sets of stored laser failure-mode event data profiles, wherein the determining a failure event similarity is also based on the comparing of the second set of event data with the one or more sets of stored laser failure-mode event data profiles.

3. The method of claim 1, further comprising predicting at least one of a failure-mode and a duration until failure based on the determined failure event similarity.

4. The method of claim 1, wherein the comparing the first set of event data includes analyzing a frequency domain representative of the first set of event data.

5. The method of claim 4, wherein the analyzing includes using a fast Fourier transform to obtain the frequency domain representation.

6. The method of claim 1, wherein the changing a failure-oriented laser system parameter includes one or more of providing a laser system notification and disabling the first laser system.

7. The method of claim 1, further comprising storing the first set of event data in an event data log.

8. The method of claim 7, wherein the storing is performed local to the first laser system.

9. The method of claim 7, wherein the storing is performed remotely to the first laser system.

10. The method of claim 7, further comprising overwriting the first set of event data with a subsequent set of event data.

11. The method of claim 7, further comprising adding the first set event data log to the one or more sets of stored laser failure-mode event data profiles.

12. The method of claim 2, wherein the first sensor is a photodiode situated to detect a pump optical power from one or more laser pump sources, and the second sensor is a thermal sensor situated to detect one or more temperatures associated with the first laser system.

13. The method of claim 2, wherein the first sensor is a voltage or current sensor situated to measure a voltage or current, respectively, associated with a power supply of the first laser system.

14. The method of claim 1, wherein the comparing the first set of event data is triggered based on one or more values of the first sensor parameter exceeding a threshold.

15. The method of claim 1, wherein the one or more sets of stored laser failure-mode event data profiles includes control settings or expected values associated with the first laser system.

16. A laser system, comprising:
a laser gain medium situated to generate an output beam;
a pump source coupled to the laser gain medium to pump the laser gain medium so as to produce optical gain;
a power supply coupled to the pump source;
a controller coupled to the pump source and power supply and situated to control the generation of the output beam;
a pump sensor coupled to the pump source and controller and situated to detect a pump source parameter and to provide a pump source parameter data set of a first predetermined duration at a pump source parameter data sampling rate to the controller;
a power supply sensor coupled to the power supply and controller situated to detect a power supply parameter and to provide a power supply parameter data set of a second predetermined duration at a power supply data sampling rate to the controller;
wherein the controller is situated to compare the pump source parameter data set and the power supply parameter data set to one or more sets of stored failure-mode event data profiles and to determine a failure event similarity so that a failure-oriented laser system parameter can be changed based on the determined failure event similarity.

17. The laser system of claim 16, wherein the controller is configured to store the pump source parameter data set and the power supply parameter data set associated with a failure of the laser system, and update the stored failure-mode event data profiles based on the stored pump source parameter and power supply parameter data sets.

18. A method, comprising:
forming a library of non-conforming data profiles based on performance parameter data of one or more laser systems in a laser system network;
comparing the non-conforming data profiles to one or more data sets of an active laser system so as to determine a similarity with at least one of the non-conforming data profiles; and
changing a setting of the active laser system in response to the comparing.

19. The method of claim 18, further comprising updating the library of non-conforming data profiles based on one or more failure-based event data sets associated with a failure event of the active laser system.

20. The method of claim 18, wherein the one or more data sets includes:
a first data set associated with an optical pump source of the active laser system,
a second data set associated with a power supply of the active laser system that is coupled to the optical pump source,
a third data set associated with a thermal sensor coupled to one or more components of the active laser system, and
an output setting associated with an output beam generated by the active laser system.

* * * * *